United States Patent
Guha

(10) Patent No.: US 6,767,762 B2
(45) Date of Patent: Jul. 27, 2004

(54) LIGHTWEIGHT SEMICONDUCTOR DEVICE AND METHOD FOR ITS MANUFACTURE

(75) Inventor: Subhendu Guha, Bloomfield Hills, MI (US)

(73) Assignee: United Solar Systems Corporation, Troy, MI (US)

( * ) Notice: Subject to any disclaimer, the term of this patent is extended or adjusted under 35 U.S.C. 154(b) by 0 days.

(21) Appl. No.: 10/201,095

(22) Filed: Jul. 23, 2002

(65) Prior Publication Data

US 2004/0018664 A1 Jan. 29, 2004

(51) Int. Cl.[7] .......................... H01L 21/44; H01L 21/30
(52) U.S. Cl. ...................................... 438/113; 438/459
(58) Field of Search ............................... 438/110, 113, 438/458, 459, 460, 462

(56) References Cited

U.S. PATENT DOCUMENTS

| | | | |
|---|---|---|---|
| 4,419,530 A | 12/1983 | Nath | 136/251 |
| 4,485,264 A | 11/1984 | Izu et al. | 136/244 |
| 4,704,369 A | 11/1987 | Nath et al. | |
| 4,754,544 A | 7/1988 | Hanak | |
| 5,268,037 A | 12/1993 | Glatfelter | 136/249 |
| 5,637,537 A | 6/1997 | Nath et al. | 438/460 |

*Primary Examiner*—David A. Zarneke
*Assistant Examiner*—Scott B. Geyer
(74) *Attorney, Agent, or Firm*—Gifford, Krass, Groh, Sprinkle, Anderson & Citkowski, P.C.

(57) ABSTRACT

An ultra lightweight semiconductor device comprises a substrate electrode, a body of semiconductor material, and a top electrode, and is manufactured by a process wherein the thickness dimension of a portion of the substrate electrode is decreased so as to reduce the weight of the device. The portions of the device having a thick substrate serve to support and reinforce the device during processing and handling. These portions may subsequently be severed away to further reduce the weight of the device. Also disclosed are configurations of ultra lightweight semiconductor devices.

19 Claims, 4 Drawing Sheets

FIG - 9
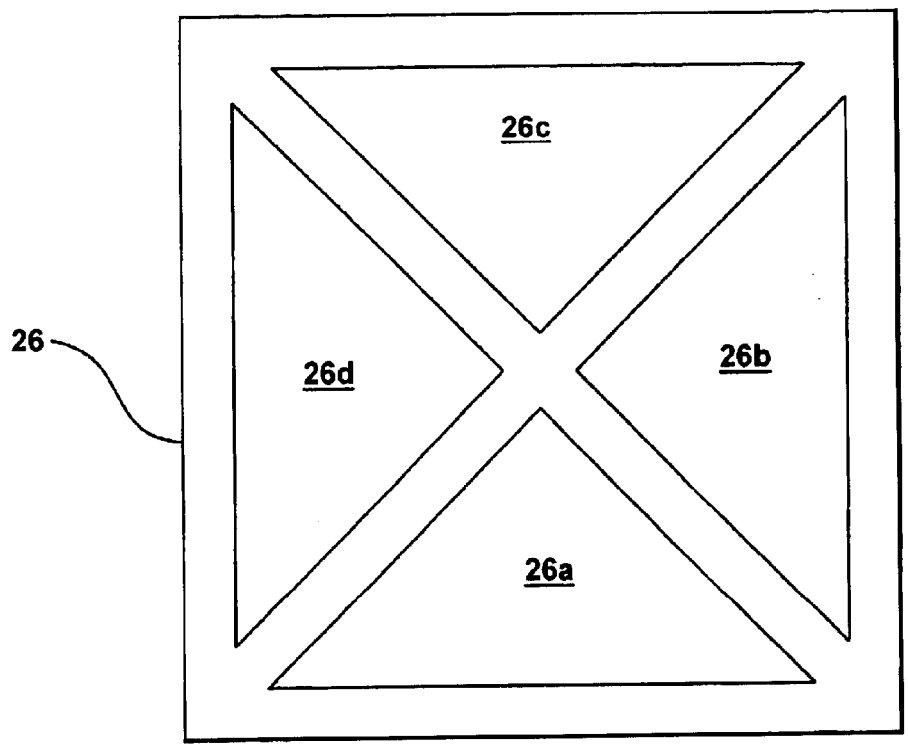
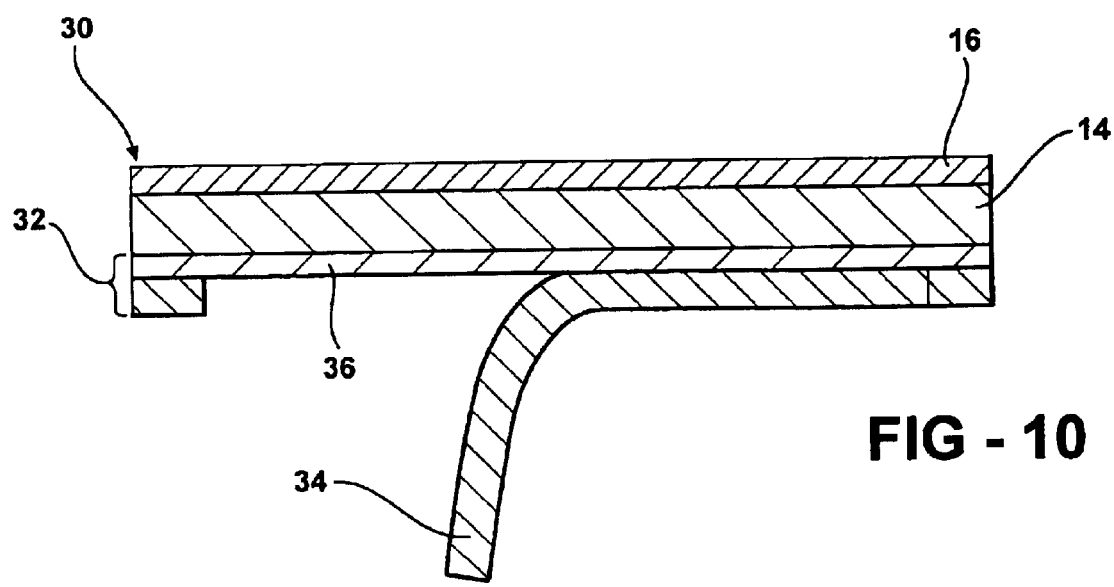
FIG - 10

LIGHTWEIGHT SEMICONDUCTOR DEVICE AND METHOD FOR ITS MANUFACTURE

FIELD OF THE INVENTION

This invention relates generally to semiconductor devices. More particularly, the invention relates to ultra lightweight semiconductor devices and methods for their fabrication. In specific embodiments, the invention relates to ultra lightweight photovoltaic devices.

BACKGROUND OF THE INVENTION

Weight is a very important factor in many semiconductor device applications. For example, large area photovoltaic generator arrays are frequently used as power sources in aerospace applications where weight is at a premium. The weight of photovoltaic devices is also of significant concern in other mobile applications, and in those particular applications in which transport of massive items is difficult. Specific power is a property of photovoltaic generator devices which is expressed in the units of watts per kilogram of generator weight. Conventional lightweight photovoltaic generators of the type employed in aerospace applications have a specific power rating of approximately 30–50 w/kg. Ultra lightweight photovoltaic generators which are based upon thin film semiconductor materials and which employ very lightweight substrates have been manufactured and such devices exhibit specific powers in the range of 500–1500 w/kg.

Heretofore, such ultra lightweight photovoltaic devices have been relatively difficult to fabricate since they are fabricated from a photovoltaic stock material comprised of a very thin substrate (typically less than 50 microns), having a number of submicron thick layers of semiconductor material supported on the substrate. The processing of such photovoltaic stock material into power generating modules generally requires that the photovoltaic material be cut to size, have current collecting leads affixed thereto, have interconnections established between subunits and that the material be encapsulated in a protective coating. The thin, lightweight nature of the material makes such processing difficult. U.S. Pat. No. 4,754,544, the disclosure of which is incorporated herein by reference, discloses various methods for the fabrication of ultra lightweight photovoltaic generator arrays. As disclosed therein, a first side of a photovoltaic material is protected by a support/encapsulating layer while processing steps are carried out on a second side thereof. Such processing can include etching away some of the thickness of a support substrate to reduce its weight. The methods disclosed therein generally do not permit simultaneous access to both surfaces of a semiconductor device during processing steps; and accordingly, it would be advantageous to have a self-supporting ultra lightweight device which would eliminate the need for a separate support layer and which can provide a device which has increased strength in its end use applications. In addition, any such device configuration and methods should be compatible with conventional semiconductor device processing technology.

As will be explained in greater detail hereinbelow, the present invention provides ultra lightweight semiconductor devices and methods for their fabrication. The devices are capable of being supported without the requirement of an overall support layer. While the drawings, discussion and description presented herein are primarily directed toward photovoltaic devices and methods for their manufacture, it is to be understood that the principles of the present invention are applicable to any type of device comprised of semiconductor material supported upon a substrate member. As such, the present invention also has significant applicability in connection with the fabrication of other large area semiconductor devices such as photo sensors, electrophotographic receptors, large area circuits, memory arrays and the like.

BRIEF DESCRIPTIONS OF THE INVENTION

There is disclosed herein a method for manufacturing a lightweight semiconductor device of the type comprising a substrate electrode, a top electrode, and a body of semiconductor material disposed therebetween in electrical communication with the top electrode and the substrate electrode. According to the present invention, a thickness dimension of the substrate electrode is decreased in a first area relative to the thickness dimension of the substrate electrode in a second area so as to define a first and second region of the semiconductor device wherein the thickness of the device in the first region is less than the thickness of the device in the second region. The thicker regions of the device provide support for the thinner regions, while the thinner regions serve to decrease the overall weight of the device.

In specific embodiments of the invention, the device is severed so as to separate the first, relatively thin region of the device from the second, relatively thick region of the device, and such severing generally takes place after at least some of the processing steps are completed. In specific embodiments of the invention in which the thick regions are severed from the thin regions, portions of the top electrode of the device are scribed away so as to delineate a boundary between the first and second regions of the device so that subsequent severing may take place along the scribed portions.

In specific embodiments, the thickness of the substrate may be reduced by etching with acid or alkali in those instances where the substrate is a metal, or by solvent treatment in those instances where the substrate is a polymeric material.

Also disclosed herein are self-supporting, lightweight semiconductor devices manufactured by the methods of the present invention.

BRIEF DESCRIPTION OF THE DRAWINGS

FIG. 9 is a bottom plan view of another embodiment of semiconductor device prepared in accord with the present invention; and FIG. 10 is a cross-sectional view of a semiconductor device illustrating an alternative method for decreasing the thickness of the substrate electrode layer.

DETAILED DESCRIPTION OF THE INVENTION

In accord with the present invention, an ultra lightweight semiconductor device is prepared from a stock semiconductor device material of the type comprising a semiconductor body interposed between a substrate electrode and a top electrode. According to the present invention, portions of the thickness of the substrate electrode are removed thereby decreasing the weight of the resultant semiconductor device. This decrease can be quite significant, since in a typical thin film semiconductor device, the substrate electrode provides the bulk of the weight of the device. (In this regard, please note that in the following drawings, the thicknesses of the semiconductor and top electrode layers have, for purposes of clarity, been exaggerated relative to the thickness of the substrate.) Non-removed portions of the substrate electrode serve to stiffen and support the remainder of the device and thereby allow processing steps, such as the affixation of current collecting leads and the like, to be carried out without damage to the device and without the need for an additional support layer. The principles of the present invention will be described with specific reference to the fabrication of an ultra lightweight photovoltaic device based upon thin film semiconductor alloys such as amorphous silicon and silicon/germanium alloys. However, it is to be understood that the principles of this invention may also be used with advantage in the manufacture of various other semiconductor devices.

Figure 1:
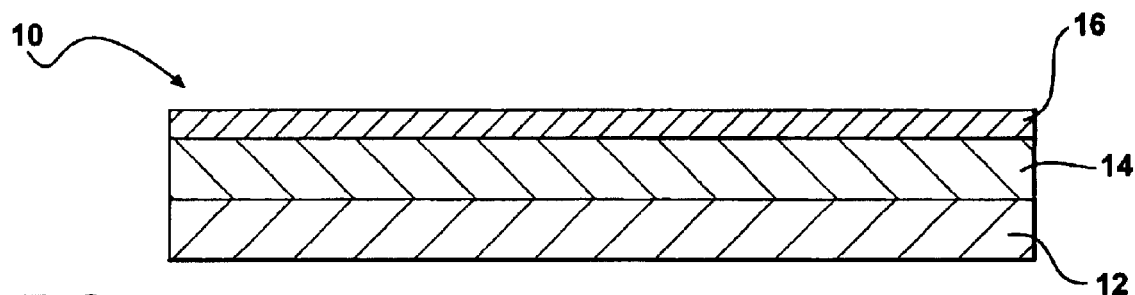
FIG. 1 is a cross-sectional view of a semiconductor device which may be employed in the practice of the present invention.

Referring now to FIG. 1, there is shown a cross-sectional view of a semiconductor device 10 which is used as a stock material for further processing in accord with the present invention. The device includes a substrate electrode 12, a body of semiconductor material 14, and a layer of top electrode material 16 disposed in a superposed relationship so that the semiconductor body 14 is in electrical communication with the substrate electrode 12 and the top electrode 16. As is known in the art, the semiconductor body 14 includes at least one photovoltaically active semiconductor junction therein, and in most instances comprises a multi-layered body of semiconductor materials. In operation, the body of photovoltaic material 14 absorbs incident illumination and generates charge carriers which are collected by the substrate electrode 12 and the top electrode 16. Electrical leads (not shown) in communication with the electrodes serve to collect photo generated current therefrom. The substrate electrode 12 may comprise a single sheet of electrically conductive material such as a sheet of stainless steel, nickel or the like. However, in many instances, the substrate electrode 12 is a multi-layered body, and as such includes reflective layers, texturizing layers, high conductivity layers and the like thereupon. In some instances, the substrate is a composite body comprised of an insulating material such as a polymer or glass having one or more electrically conductive layers disposed thereupon in electrical communication with the semiconductor body 14. It is to be understood that all of such electrode structures may be employed in the practice of the present invention. The top electrode 16 is generally fabricated from a transparent, electrically conductive material such as a transparent electrically conductive oxide material (TCO) as is well known in the art. In those instances where the semiconductor device is not a photo responsive device, or in those instances where the substrate electrode 12 is transparent, the top electrode 16 may be fabricated from an opaque, electrically conductive material. It is to be understood that still further layers of material may be interposed between the semiconductor body 14 and the electrodes 12, 16, depending on the nature of the final device, and the present invention may be employed in connection with all of such configurations of devices.

Figure 2:
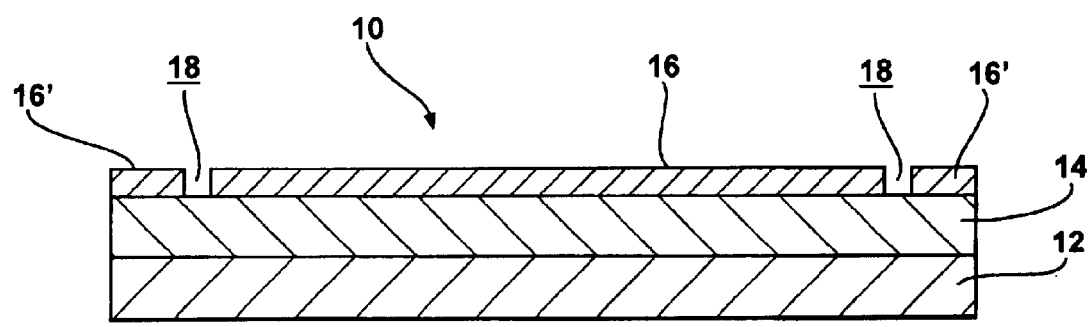
FIG. 2 is a cross-sectional view of the semiconductor device of FIG. 1 at a first stage in its processing.

High volume, high speed, roll-to-roll processes have been developed for fabricating very large area bodies of photovoltaic material of the general configuration shown in FIG. 1. This material can be severed into smaller area portions which are subsequently processed and configured into power generating modules. In a typical first step of the process for photovoltaic generator fabrication, the top electrode 16 is scribed so as to electrically isolate selected portions of the top electrode 16. As illustrated in FIG. 2, edge portions 16' of the top electrode are separated from the remainder of the top electrode 16 by a scribe line 18 formed therethrough.

Figure 3:
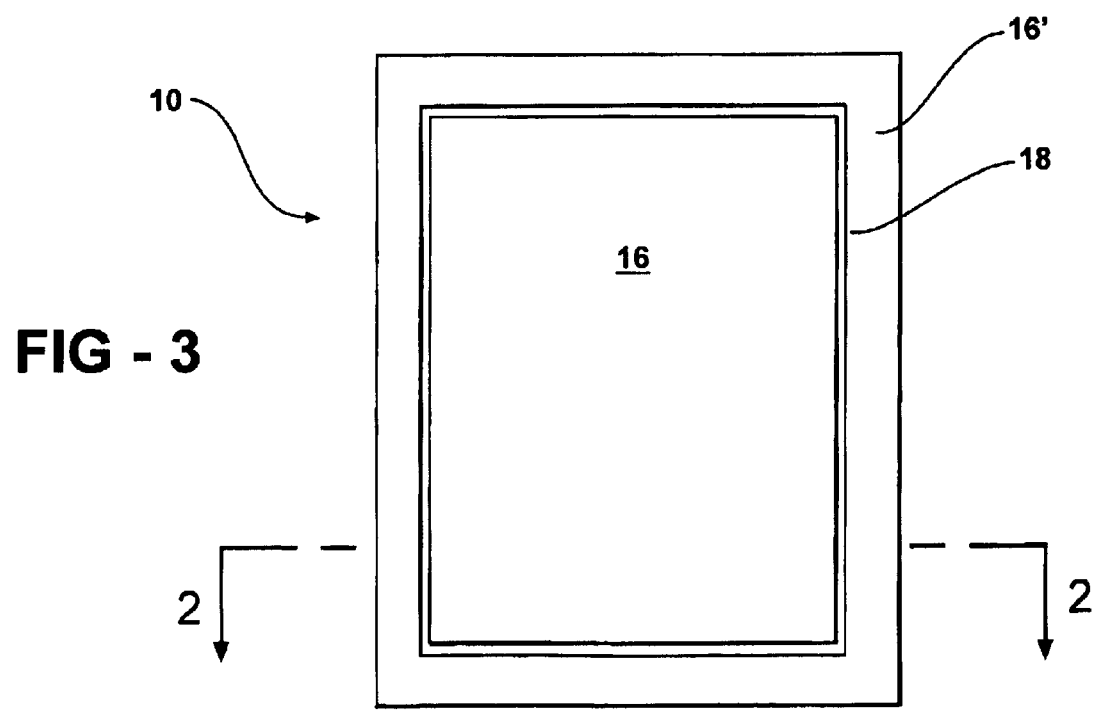
FIG. 3 is a top plan view of the device of FIG. 2.

Referring now to FIG. 3, there is shown a top plan view of the device 10 of FIG. 2, wherein FIG. 2 comprises a cross-sectional view taken along line II—II. As will be seen, in this instance, the scribe line 18 extends around the entirety of the top electrode 16 of the device. In other instances, the scribing may only extend along one or two edges of the device. In the FIG. 3 embodiment, the scribing serves to electrically isolate the central portion of the top electrode 16 from the perimeter portion 16', since the lateral electrical conductivity of the semiconductor body 14 is relatively low. The scribing step may be implemented by any technique well known in the art such as chemical etching, water jet scribing, laser scribing, abrasive scribing, masking or the like. It is also to be understood that the present invention may be practiced without the scribing step.

Figure 4A:
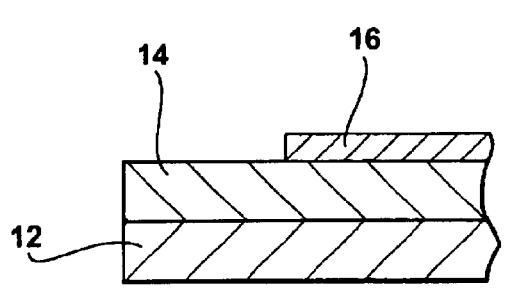
FIGS. 4A–4D are cross-sectional views of etched portions of semiconductor devices of the general type shown in FIG. 1, illustrating alternative scribing embodiments.
Figure 4B:
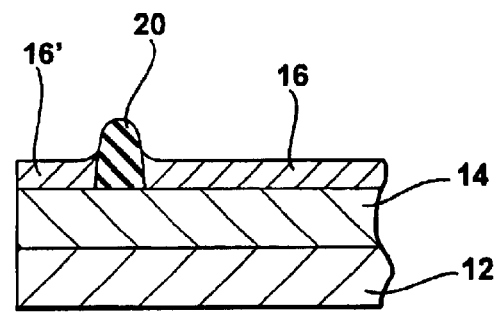
Figure 4C:
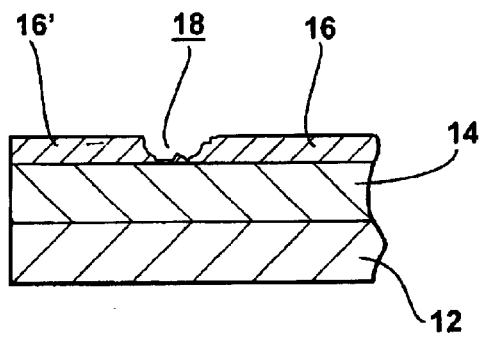
Figure 4D:
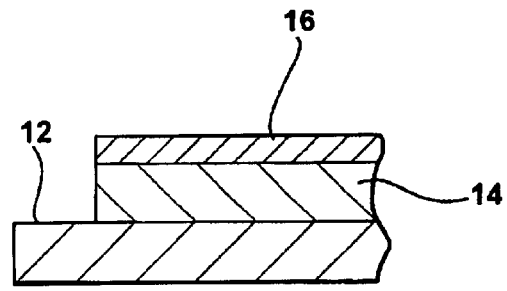

Referring to FIGS. 4A–4D, there are shown several alternative scribing configurations. In FIG. 4A, the scribing is carried out to the periphery of the device so as to create a relatively large portion free of the top electrode material. Such scribing may be carried out most advantageously by masking the etched portions of the semiconductor body 14 during deposition steps for the top electrode layer 16. FIG. 4B shows an alternative scribing method whereby a body of resist material 20 is deposited upon the semiconductor body 14 prior to the deposition of the top electrode 16. This resist material is relatively thick, and this relatively thick bead of masking material prevents the deposition of a continuous layer of top electrode material on the device effectively producing a scribed region. Techniques for implementing this embodiment are disclosed in U.S. Pat. No. 4,485,264, which is incorporated herein by reference. FIG. 4C shows yet another embodiment of scribing configuration. As illustrated therein, the scribe line 18 does not extend through the entirety of the thickness of the top electrode layer 16. Since the lateral electrical conductivity of both the top electrode material and the semiconductor body 14 are relatively high, such a partial scribe will effectively isolate the perimeter portion 16' from electrical contact with the main portion 16 of the top electrode. Also, it is to be understood that the scribe line may extend into the semiconductor body and even into portions of the electrode 12 without comprising the practice of the present invention. FIG. 4D shows another embodiment wherein the entirety of the top electrode 16 and the semiconductor body 14 are scribed away in the peripheral region, exposing the substrate 12. The specific scribe configuration will, in many instances, be determined by requirements of the device fabrication process.

Figure 5:
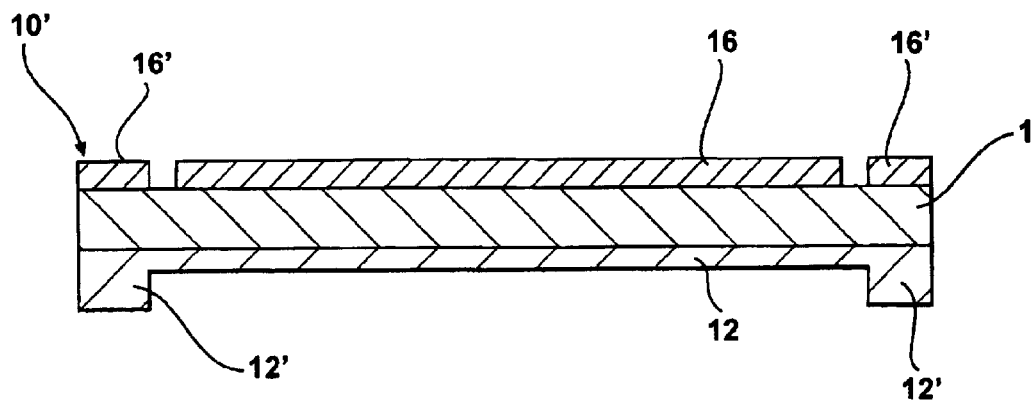
FIG. 5 is a cross-sectional view of the device of FIG. 2 at a further stage in the processing thereof.

Referring now to FIG. 5, there is shown a cross-sectional view of the device 10 of FIG. 2, at a further stage in its processing. As shown in FIG. 5, a portion of the thickness of the substrate electrode 14 has been removed, with the result being that the overall thickness of the semiconductor device is decreased in a first region, which in this embodiment corresponds generally to that of the main portion of the top electrode 16, relative to a second region, which corresponds to the remainder of the device. The thickness of the substrate can be reduced by etching or dissolution. In those instances where the substrate is formed from metals such as stainless steel, nickel, aluminum or the like, etching is most preferably carried out by the use of the appropriate acidic or alkaline etchant solutions. As will be apparent to those of skill in the art, the etching process may be readily controlled by masking the substrate with a resist material or by otherwise restricting the action of the etchant material. In those instances where nonmetallic substrates are employed, substrate thickness can be reduced by the use of an appropriate solvent mixture which dissolves and/or degrades the substrate material. As is known to those of skill in the art, the etching or dissolution processes may be controlled with sufficient accuracy to enable uniform and reproducible thinning of the substrates to take place. Specific etching techniques are disclosed in U.S. Pat. No. 4,754,544 referenced above. Thickness reduction may also be accomplished by physical methods such as laser or abrasive ablation.

The device of FIG. 5 is relatively lightweight, and in one preferred embodiment, the substrate electrode 14 is thinned down so as to be no more than 50 microns thick, and in some specific embodiments, the substrate electrode 14 is thinned down to a thickness of no more than 25 microns. Such thin substrates significantly reduce the overall weight of the semiconductor device. In the FIG. 5 configuration, the thicker portions of the substrate 12' confer rigidity on the device and also provide anchor points whereby the device can be supported. This support and rigidity enables the device 10 to undergo subsequent processing steps, such as the affixation of current collecting leads, testing, and the like, without damage.

Figure 6:
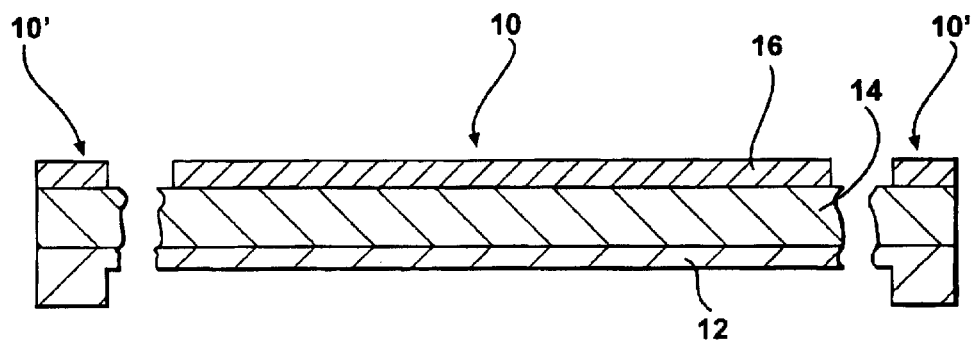
FIG. 6 is a cross-sectional view of the device of FIG. 5 following a subsequent step of processing.

FIG. 6 illustrates a subsequent and optional processing step whereby the thicker regions 10' of the device 10 are severed away from the main body of the device thereby further decreasing the overall weight of the device 10. This severing step preferably takes place once the majority of the processing of the device has been complete. Severing can take place through the scribed regions of the top electrode 16. Alternatively, severing can also be implemented in those instances where the top electrode has not been scribed. There are a number of techniques known in the art for severing photovoltaic devices of this type, and such techniques are disclosed, for example, in U.S. Pat. Nos. 5,637,537 and 4,704,369, which are incorporated herein by reference. Following the severing, the ultra lightweight device of FIG. 6 may be further processed. For example, the device may be encapsulated into a polymeric body to provide support and protection. In some instances, the device of FIG. 6 may be interconnected to other ultra lightweight photovoltaic devices to form a large area module which may be subsequently encapsulated or otherwise unitized.

Figure 7:
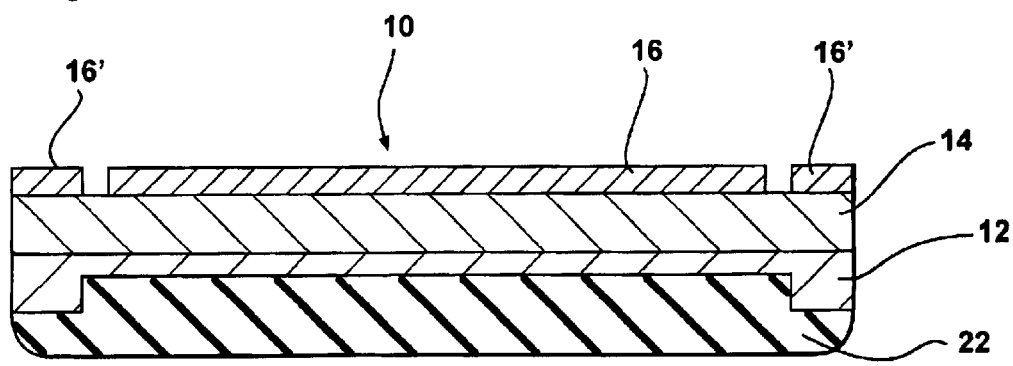
FIG. 7 is a cross-sectional view of the device of FIG. 5 showing an alternative, subsequent processing step.
Figure 8:
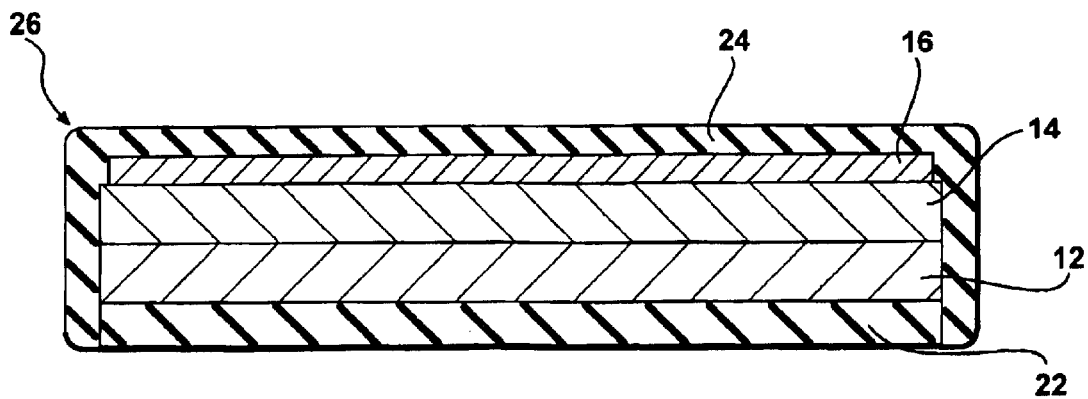
FIG. 8 is a cross-sectional view of an encapsulated, ultra lightweight semiconductor device prepared according to the present invention.

Encapsulation may also be implemented prior to any severing step. Referring now to FIG. 7, there is shown a device 10 generally similar to the device of FIG. 5 which further includes a layer of encapsulant material covering the substrate electrode 12 thereof. This encapsulant material 22 may comprise a polymeric material or, depending upon the particular application, an inorganic material. As illustrated, the encapsulant layer 22 is relatively thick compared to the substrate; however, thinner layers may be likewise employed. Even in those instances where thick encapsulant layers are utilized, the overall weight of the device is significantly decreased since the encapsulant layers are of much lower density than metallic substrates; and since most devices, whether having thick or thin substrates, are encapsulated. The device of FIG. 7 may be severed, as described with reference to the FIG. 5 embodiment, so as to remove the thick portions therefrom, and once severed, it may have a top and side encapsulant applied thereto. FIG. 8 depicts a cross-sectional view of the device of FIG. 7, having the thicker regions thereof severed away, and further including a layer of top encapsulant material 24 which wraps around the sides of the device and joins the layer of bottom encapsulant material 22 so as to produce an environmentally sealed, ultra lightweight photovoltaic generator 26.

Yet other embodiments of the present invention may be implemented. As discussed hereinabove, in some instances, the thicker portions of the semiconductor device may not be severed away from the thinner portions so that the thicker portion will remain to provide structural integrity and rigidity to the finished semiconductor device. Such devices represent a compromise between ultra light weight and strength, and will find utility in a number of applications where rigidity is required. By thinning the substrate electrode in an appropriate pattern, light weight and rigidity may be maximized. Referring now to FIG. 9, there is shown a bottom plan view of a semiconductor device structured in accord with the principles of the present invention. Visible in this view is a substrate electrode 26 having three triangular portions 26a–26d of reduced thickness. This thickness reduction leaves a perimeter and cross brace reinforcement pattern comprised of the thicker portions of the substrate 26, and this structure provides rigidity and reinforcement. Other such patterns will be readily apparent to one of skill in the art.

In yet other embodiments of the invention, the thickness of the substrate may be reduced by techniques which do not require etching or salvation. Referring now to FIG. 10, there is shown a semiconductor device 30 which includes a semiconductor body 14, and a top electrode 16 as generally described hereinabove. The device 30 of FIG. 10 includes a dual layered, separable, substrate 32 which is comprised of a first layer 34 and a second layer 36. The second layer 36 is electrically conductive, and is disposed so as to be in electrical communication with the semiconductor body 14. The first layer 34 of the substrate 32 need not be electrically conductive, and is separably affixed to the second layer 36, as for example by a contact adhesive, a thermally disruptable adhesive, or the like. In this embodiment, thinning of the substrate 32 is accomplished by peeling away the first layer 34 from the second layer 36. The peeling away can be facilitated by scoring the substrate by use of a scribe, a hot knife, a laser or the like.

The foregoing drawings, discussion and description are illustrative of some specific embodiments of the present invention, and are not meant to be construed as being limitations upon the practice thereof. Yet other embodiments of the invention will be readily apparent to one of skill in the art. It is the following claims, including all equivalents, which define the scope of the invention.

What is claimed is:

1. A method for manufacturing a lightweight semiconductor device, said method comprising the steps of:

providing a semiconductor device comprising a substrate electrode, a top electrode, and a body of semiconductor material disposed therebetween in electrical communication with said top electrode and said substrate electrode;

decreasing a thickness dimension of the substrate electrode in a first area thereof relative to a thickness dimension of the substrate electrode in a second area thereof so as to define a first and a second region of said semiconductor device wherein the thickness of the device in the first region is less than the thickness of the device in the second region; and severing said semiconductor device so as to separate the first region from the second region.

2. The method of claim 1, including the further step of scribing said top electrode so as to define a first portion of said top electrode corresponding to said first region of said semiconductor device, and a second portion of said top electrode corresponding to said second region of said semiconductor device.

3. The method of claim 2, wherein said step of severing said semiconductor device comprises severing said semiconductor device by cutting through said top electrode where it has been scribed.

4. The method of claim 2, wherein said step of scribing said top electrode comprises scribing said top electrode to the use of a scribing agent selected from the group consisting of: a laser, a water jet, a chemical etchant, an abrasive, and combinations thereof.

5. The method of claim 2, wherein said step of scribing said top electrode comprises disposing a pattern of resist material onto said semiconductor device during its fabrication, and prior to the time said top electrode is applied thereto, said resist material being operative to disrupt said top electrode.

6. The method of claim 1, wherein said step of decreasing the thickness of said substrate electrode comprises etching said substrate electrode.

7. The method of claim 6, wherein said substrate electrode comprises a metallic layer, and the step of etching said substrate electrode comprises contacting said metallic layer with an acid or an alkali.

8. The method of claim 6, wherein said substrate electrode comprises a layer of an organic, polymeric material, and the step of etching said substrate electrode comprises contacting said layer of organic, polymeric material with a solvent.

9. The method of claim 1, wherein said step of decreasing a thickness dimension of the substrate in the first area comprises decreasing said thickness so that the thickness of said substrate in said first area is no more than 50 microns.

10. The method of claim 1, wherein said substrate electrode comprises stainless steel.

11. The method of claim 1, wherein said top electrode comprises a transparent, electrically conductive electrode.

12. The method of claim 1, wherein said semiconductor body comprises a plurality of layers of thin film semiconductor material.

13. The method of claim 1, wherein said semiconductor body comprises a photovoltaic body.

14. The method of claim 1, wherein said semiconductor device is a generally planar device having a quadrilateral shape, and wherein said second region extends along at least two edges of said quadrilateral.

15. The method of claim 14, wherein said second region forms a perimeter which bounds said quadrilateral.

16. The method of claim 1, wherein subsequent processing steps are carried out on the semiconductor device prior to the step of severing.

17. A method for manufacturing a lightweight semiconductor device, said method comprising the steps of:

providing a semiconductor device comprising a substrate electrode comprised of a layer of an organic polymeric material having a metallic layer thereatop, a top electrode, and a body of semiconductor material disposed therebetween in electrical communication with said top electrode and said metallic layer of said substrate electrode;

decreasing a thickness dimension of the substrate electrode in a first area thereof relative to a thickness dimension of the substrate electrode in a second area thereof by an etching process which comprises contacting said layer of organic polymeric material with a solvent, so as to define a first and a second region of said semiconductor device wherein the thickness of the device in the first region is less than the thickness of the device in the second region.

18. A method for manufacturing a lightweight semiconductor device, said method comprising the steps of:

providing a generally planar, quadrilaterally-shaped semiconductor device comprising a substrate electrode, a top electrode, and a body of semiconductor material disposed therebetween in electrical communication with said top electrode and said substrate electrode;

decreasing a thickness dimension of the substrate electrode in a first area thereof relative to a thickness dimension of the substrate electrode in a second area thereof so as to define a first and a second region of said semiconductor device wherein the thickness of the device in the first region is less than the thickness of the device in the second region, and wherein said second region extends along at least two edges of said quadrilateral.

19. The method of claim 18, wherein said second region forms a perimeter which bounds said quadrilateral.

* * * * *